United States Patent [19]
Spann et al.
[11] 3,728,559
[45] Apr. 17, 1973

[54] HYBRID HIGH SPEED ECL TO P-CHANNEL MOS CLOCK DRIVER

[75] Inventors: John C. Spann, Baltimore; James F. Gentry, Prince Georges, both of Md.
[73] Assignee: Westinghouse Electric Corporation, Pittsburgh, Pa.

[22] Filed: Nov. 26, 1971
[21] Appl. No.: 202,437
[52] U.S. Cl. ....................307/264, 307/254, 307/262, 307/270, 330/30 D
[51] Int. Cl. ..............................H03k 1/14, H03k 5/02
[58] Field of Search........................307/243, 254, 235, 307/262, 264, 270; 330/30 D

[56] References Cited
UNITED STATES PATENTS
3,553,491 1/1971 Schulz ................................330/30 D
3,609,405 9/1971 Surprise et al. ......................330/30 D

*Primary Examiner*—John Zazworsky
*Attorney*—F. H. Henson et al.

[57] ABSTRACT

A voltage level shifting circuit which can be used as a high speed MOS clock driver, for example, driven by any emitter-coupled, non-saturated logic device. This is achieved, among other things, by the use of transformer coupling which offers isolation, minimal power requirements, and maximum efficiency. At the same time, the circuitry permits hybrid circuit packaging. The circuit has a broad frequency range and minimal rise and fall times for digital signals while feeding into a capacitive load.

7 Claims, 1 Drawing Figure

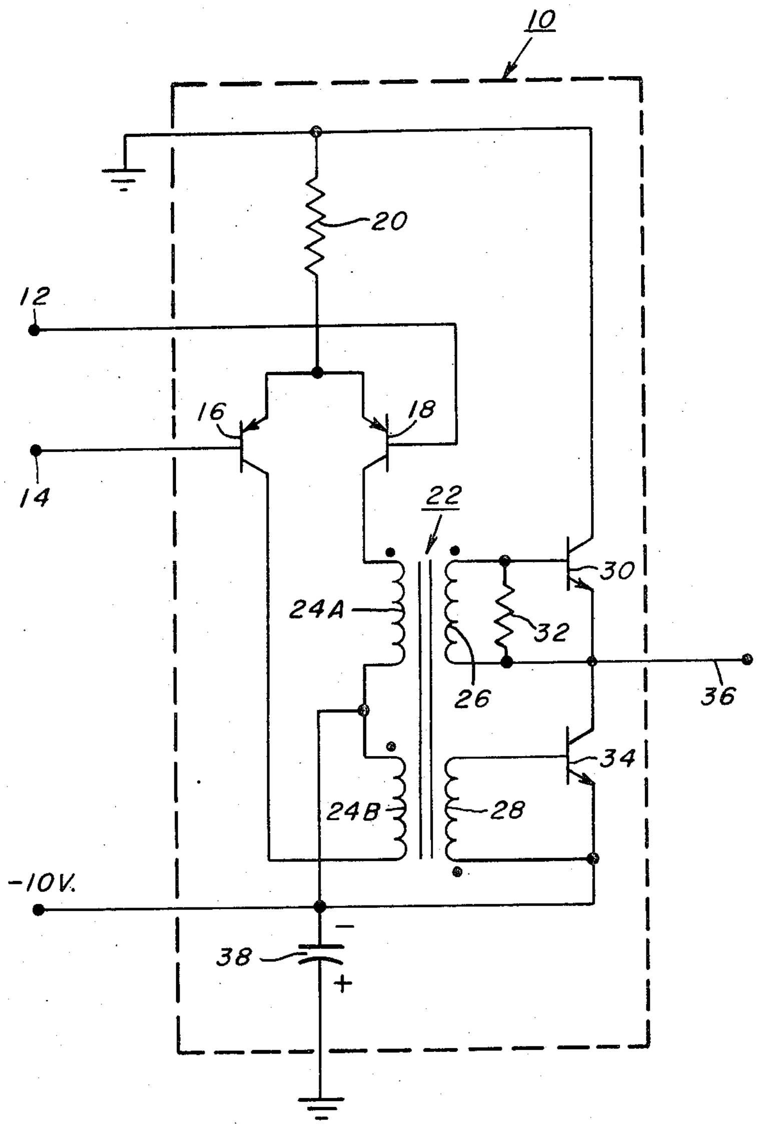
10
20
12
16
18
14
22
24A
30
32
26
36
24B
34
28
-10V.
38

HYBRID HIGH SPEED ECL TO P-CHANNEL MOS CLOCK DRIVER

BACKGROUND OF THE INVENTION

As is known, there are instances where it is necessary to shift the voltage level of digital pulses in integrated circuit applications. For example, in certain cases it is necessary to provide a high speed emitter-coupled logic (ECL) to P-channel metal oxide semiconductor (MOS) clock driver circuit which can be fabricated on the same (i.e., hybrid) semiconductor substrate. At the same time, the circuit must be capable of converting the voltage level of pulses at a frequency in excess of 20 megahertz with rise and fall times of the pulses being less than 10 nanoseconds while driving a 250 picofarad capacitive load. Heretofore, no available integrated circuit has been devised for accomplishing this function.

SUMMARY OF THE INVENTION

In accordance with the present invention, a hybrid circuit, capable of fabrication on a single nonconductive substrate, is provided which has all of the desirable characteristics outlined above. Specifically, there is provided a pair of transistors having their emitters connected to a source of reference potential, a transformer having a primary winding and a pair of secondary windings, and means connecting the collectors of the transistors to opposite ends of the primary winding. Input signals are applied to the bases of the aforesaid transistors, either by applying complements of the input signal to the respective bases or by applying the input pulses to one base while establishing a fixed potential on the other base.

The collectors of the transistors are connected to the opposite ends of the primary winding on the aforesaid transformer; while means are provided for connecting a center tap on the primary winding of the transformer to a source of driving potential. A pair of output transistors is provided having their emitters and collectors connected in series between the point of reference potential and the source of driving potential; while one of the secondary windings on the transformer is connected between the base and emitter of one of the output transistors. The other of the secondary windings is connected between the base and emitter of the other output transistor such that the polarity of the signal applied to the base of one transistor will always be opposite to that applied to the other transistor. Output signals are derived from the junction of the two series-connected transistors, preferably the junction between the emitter of one output transistor and the collector of the other output transistor.

The above and other objects and features of the invention will become apparent from the following detailed description taken in connection with the accompanying single FIGURE drawing which forms a part of this specification.

With reference now to the drawing, the circuit shown is fabricated on a single or hybrid substrate, generally indicated by the reference numeral 10. Two input terminals 12 and 14 are connected to the bases of two PNP transistors 16 and 18, respectively, formed in the substrate 10 by conventional integrated circuit techniques. The emitters of the transistors 16 and 18 are connected through a common resistor 20 to a source of reference potential (i.e., ground). The collectors of the transistors 16 and 18, in turn, are connected to the end of the primary winding of a transformer 22. As shown, the primary winding is divided into an upper half 24A and a lower half 24B with the mid-tap or junction between the two halves being connected to a source of negative potential, such as −10 volts. The upper and lower halves 24A and 24B of the primary winding of transformer 22 are wound in the same direction so as to produce the same polarities at the tops thereof as indicated by the dots thereon.

There are two secondary windings 26 and 28 for the transformer 22 wound to produce opposite polarity voltages as indicated by the dots thereon. The upper end of the secondary winding 26 is connected to the base of a first NPN output transistor 30; while its lower end is connected to the emitter of the same transistor 30. A resistor 32 is connected in shunt with the base-emitter junction of transistor 30. In a similar manner, the upper end of winding 28 is connected to the base of a second NPN output transistor 34; while its lower end is connected to the emitter of this same transistor. The transistors 30 and 34 are formed by conventional integrated circuit techniques in the substrate 10 and are connected in series. The collector of transistor 30 is grounded; the emitter of transistor 34 is connected to a source of −10 volts; and the emitter and collector of transistors 30 and 34, respectively, are interconnected. Output signals are derived on terminal 36 from the junction of the emitter and collector of transistors 30 and 34. A capacitor 38 is connected between a source of negative potential as shown and ground. This capacitor will normally charge with the polarity shown but will discharge whenever one of the transistors 16 and 18 conducts to provide a large current surge through the windings of transformer 22.

The operation of the circuit is as follows. Transistors 16 and 18 along with resistor 20 form a level shifting network. There are several possible methods of applying an input signal to the two terminals 12 and 14. One mode of operation is to connect one of the inputs to a reference voltage source and connect the actual input signal to the remaining input. In this mode, the network acts like a differential comparator and causes either transistor 16 or 18 to turn ON, dependent upon the input voltage polarity relative to the reference voltage. A second mode of operation is to connect the two input signals to the "true" and "complement" outputs of a logic gate. This mode of operation causes transistors 16 and 18 to switch faster, thereby allowing for faster rise and fall times and higher frequencies of operation.

The emitter current through resistor 20 is determined by the magnitude of the voltages on the bases of transistors 16 and 18. The collector current delivered to the load transformer 22 is regulated by the action of transistors 16 and 18 and resistor 20. In the case where the inputs are tied to complementary emitter-coupled logic gates (e.g., voltage on terminal 12 is −0.7 volt and voltage on terminal 14 is −1.5 volts), then:

$$I_C \approx I_E = V_{b16} - V_{b18} / R_{20} \quad (1)$$

or $$I_C \approx I_E = -1.5\text{V} - (0.7)/15 = 53 \text{ milliamperes} \quad (2)$$

where:

$I_C$ = collector current;

$I_E$ = emitter current;

$V_{b16}$ = voltage on terminal 14;
$V_{b18}$ = voltage on terminal 12; and
$R_{20}$ = resistance of resistor 20 (assume 15 ohms).

The collector currents of this circuit are essentially constant because of the current limiting function of resistor 20 and because transformer 22 presents a balanced load to the transistors 16 and 18.

Transformer 22 is a hexfilar device wound on an 80 mil ferrite memory core mounted on the substrate 10. The turns ratio is approximately 3:1; and the inductance of the primary coils is about 120 microhenries when a 50 percent duty cycle operation is desired. When a primary current of approximately 53 milliamperes is delivered to one of the primary windings 24A or 24B, a current of approximately 150 milliamperes is induced in the secondary winding. As mentioned above, the polarities which appear across the secondary windings 26 and 28 are opposite. Consequently, the transistors 30 and 34 can never be turned ON simultaneously. When transistor 30 is ON, a base current of 150 milliamperes is injected into the emitter-base junction of this transistor. Assuming a gain for transistors 30 and 34 of only 3 (which is the worst case possible), the collector current available to be delivered to the output terminal 36 is about 450 milliamperes. The transistors 30 and 34 should be selected so as to have very low input capacitance, very fast rise and fall times, and extremely high gain bandwidth products.

A typical representative capacitive load for a P-channel MOS clock system is on the order of 250 picofarads through a 10-volt swing. Using these typical values, the calculated switching times obtainable with this circuit are on the order of about 5.5 nanoseconds. The circuit can operate over a frequency range of from 100 kilohertz to 20 megahertz while still maintaining rise and fall times of less than 10 nanoseconds. The push-pull balanced transformer configuration allows for maximum operating efficiency while meeting the extreme rise and fall times required.

The use of a single substrate offers distinct advantages over conventional techniques. The entire circuit, transformer included, requires an extremely small volume with a resultant size reduction. The longest wire in the package need not be any longer than 0.1 inch which enhances high speed operation. Since all of the component chips are mounted on one substrate, it becomes much easier to provide a good thermal path when the power levels so dictate. The substrate concept also allows for higher speeds, greater packaging densities and greater thermal management than conventional packaging methods.

While there are a great many areas in which the circuit can be used, its primary usage is as a clock driver circuit wherein the load presented to the output is a capacitive load which requires fast rise and fall times while operating at high frequencies. Two of these circuits can be driven from a common timing source to form a two-phase clock driver circuit. Furthermore, with a slight modification in transformer design, a four-phase MOS clock system can easily be produced. This circuit, as is, can be used to drive several MOS data input channels simultaneously. Another feature of the invention is that the input circuit need not be restricted to emitter-coupled logic and can be used for several different logic systems.

although the invention has been shown in connection with a certain specific embodiment, it will be readily apparent to those skilled in the art that various changes in form and arrangement of parts may be made to suit requirements without departing from the spirit and scope of the invention.

We claim as our invention:

1. Circuit apparatus for converting pulses of one frequency and voltage level into pulses of the same frequency but different voltage level, comprising a pair of input transistors having their emitters connected to a source of reference potential, a transformer having a primary winding and a pair of secondary windings, means connecting the collectors of said input transistors to the opposite ends of said primary winding, means connecting a center tap on said primary winding to a source of driving potential, a pair of output transistors having their emitters and collectors connected in series between said point of reference potential and said source of driving potential, means connecting one of said secondary windings between the base and emitter of one of said output transistors, means connecting the other of said secondary windings between the base and emitter of the other of said output transistors, and means for deriving an output from the junction between said output transistors.

2. The apparatus of claim 1 wherein the secondary windings of said transformer are connected between the base and emitter of the respective output transistors such that the transistors cannot be turned ON simultaneously.

3. The apparatus of claim 2 wherein the bases of the respective output transistors are of the same conductivity-type material and said secondary windings are connected to the respective bases such that the polarities of the voltages thereon will always be reversed.

4. The apparatus of claim 1 wherein the emitter of one of said output transistors is connected to said source of driving potential, the collector of the other output transistor is connected to said point of reference potential, the collector of said one output transistor and the emitter of the other output transistor being interconnected, and the output being taken from said interconnected emitter and collector.

5. The apparatus of claim 1 including a capacitor connected between the mid-tap on said primary winding and a source of potential.

6. The apparatus of claim 1 wherein all of the circuit elements recited therein including said transformer are mounted on a single nonconductive substrate.

7. The apparatus of claim 6 wherein said transformer is wound on a ferrite memory core.

* * * * *